United States Patent
Liu et al.

(10) Patent No.: US 7,808,812 B2
(45) Date of Patent: Oct. 5, 2010

(54) ROBUST 8T SRAM CELL

(75) Inventors: Jack Liu, Taipei (TW); Shao-Yu Chou, Hsin-Chu (TW); Hung-Jen Liao, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 86 days.

(21) Appl. No.: 12/238,850

(22) Filed: Sep. 26, 2008

(65) Prior Publication Data

US 2010/0080045 A1    Apr. 1, 2010

(51) Int. Cl.
    *G11C 11/00* (2006.01)
(52) U.S. Cl. ........................... 365/156; 365/158
(58) Field of Classification Search ............... 365/156, 365/158
    See application file for complete search history.

(56) References Cited

U.S. PATENT DOCUMENTS

| | | | |
|---|---|---|---|
| 6,542,401 B2 * | 4/2003 | Yamauchi et al. | 365/154 |
| 6,590,802 B2 * | 7/2003 | Nii | 365/156 |
| 6,606,276 B2 * | 8/2003 | Yamauchi et al. | 365/230.05 |
| 7,177,177 B2 * | 2/2007 | Chuang et al. | 365/154 |

OTHER PUBLICATIONS

Ramadurai, Vinod et al., "A Disturb Decoupled Column Select 8T SRAM Cell", IEEE 2007 Custom Intergrated Circuits Conference (CICC), pp. 25-28.

* cited by examiner

*Primary Examiner*—Michael T Tran
(74) *Attorney, Agent, or Firm*—K&L Gates LLP

(57) ABSTRACT

This invention discloses a static random access memory (SRAM) cell which comprises a pair of cross-coupled inverters having a first storage node, a first NMOS transistor having a source and a drain connected between the first storage node and a bit-line, a second NMOS transistor having a source and a drain connected between a gate of the first NMOS transistor and a word-line, the second NMOS transistor having a gate connected to a first column select line, and a third NMOS transistor having a source and a drain connected between a ground (VSS) and the gate of the first NMOS transistor, and a gate connected to a second column select line, the second column select line being complementary to the first column select line.

18 Claims, 3 Drawing Sheets

ROBUST 8T SRAM CELL

BACKGROUND

The present invention relates generally to static random access memory (SRAM) cell, and, more particularly, to a SRAM cell that comprises eight transistors (8-T).

Semiconductor memory devices include, for example, static random access memory, or SRAM, and dynamic random access memory, or DRAM. DRAM memory cell has only one transistor and one capacitor, so it provides a high degree of integration. But DRAM requires constant refreshing, its power consumption and slow speed limit its use mainly for computer main memories. SRAM cell, on the other hand, is bi-stable, meaning it can maintain its state indefinitely as long as an adequate power is supplied. SRAM can operate at a higher speed and lower power dissipation, so computer cache memories use exclusively SRAMs. Other applications include embedded memories and networking equipment memories.

One well-known conventional structure of a SRAM cell is a six transistor (6-T) cell that comprises six metal-oxide-semiconductor (MOS) transistors. Briefly, a 6-T SRAM cell 100, as shown in FIG. 1, comprises two identical cross-coupled inverters 102 and 104 that form a latch circuit, i.e., one inverter's output connected to the other inverter's input. The latch circuit is connected between a power and a ground. Each inverter 102 or 104 comprises a NMOS pull-down transistor 115 or 125 and a PMOS pull-up transistor 110 or 120. The inverter's outputs serve as two storage nodes C and D, when one is pulled to low voltage, the other is pulled to high voltage. A complementary bit-line pair BL and BLB is coupled to the pair of storage nodes C and D via a pair of pass-gate transistors 130 and 135, respectively. The gates of the pass-gate transistors 130 and 135 are commonly connected to a word-line PGC. When the word-line voltage is switched to a system high voltage, or VCC, the pass-gate transistors 130 and 135 are turned on to allow the storage nodes C and D to be accessible by the bit-line pair BL and BLB, respectively. When the word-line voltage is switched to a system low voltage, or VSS, the pass-gate transistors 130 and 135 are turned off and the storage nodes C and D are essentially isolated from the bit lines, although some leakage can occur. Nevertheless, as long as VCC is maintained above a threshold, the state of the storage nodes C and D is maintained indefinitely.

However, the traditional 6-T SRAM cell 100 faces many challenges as processes migrate to deep submicron technologies. One of the challenges is very low operating voltages to adapt to transistor's small sizes. The low operating voltage causes read operation instability as the transistors' threshold voltages are too large as compared with the operating voltage, hence leave little switching margins. A word-line turns on the pass-gate transistors 130 and 135 of all the cells in a row, even though only one cell is accessed. Those other cells in the roll are subjected to disturb. As such, what is desired is a new SRAM cell when forming a memory array the new SRAM cell allows better selection with minimum disturbance to neighboring cells.

SUMMARY

This invention discloses a static random access memory (SRAM) cell which comprises a pair of cross-coupled inverters having a first storage node, a first NMOS transistor having a source and a drain connected between the first storage node and a bit-line, a second NMOS transistor having a source and a drain connected between a gate of the first NMOS transistor and a word-line, the second NMOS transistor having a gate connected to a first column select line, and a third NMOS transistor having a source and a drain connected between a ground (VSS) and the gate of the first NMOS transistor, and a gate connected to a second column select line, the second column select line being complementary to the first column select line.

The construction and method of operation of the invention, however, together with additional objectives and advantages thereof will be best understood from the following description of specific embodiments when read in connection with the accompanying drawings.

BRIEF DESCRIPTION OF THE DRAWINGS

The drawings accompanying and forming part of this specification are included to depict certain aspects of the invention. A clearer conception of the invention, and of the components and operation of systems provided with the invention, will become more readily apparent by referring to the exemplary, and therefore non-limiting, embodiments illustrated in the drawings, wherein like reference numbers (if they occur in more than one view) designate the same elements. The invention may be better understood by reference to one or more of these drawings in combination with the description presented herein.

DESCRIPTION

The present invention discloses an eight-transistor (8-T) SRAM cell that allows individual cells to be selected for avoiding disturbing issue.

Figure 1:
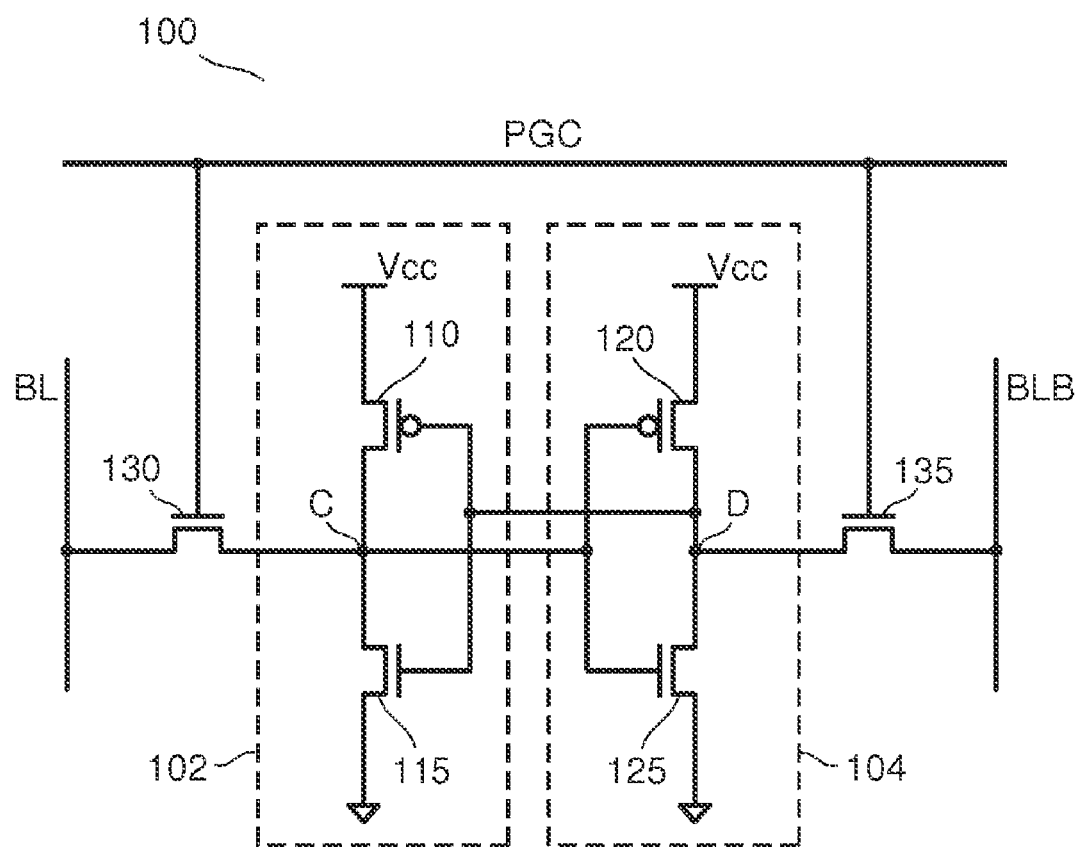
FIG. 1 is a schematic diagram illustrating a conventional 6-T SRAM cell.
Figure 2:
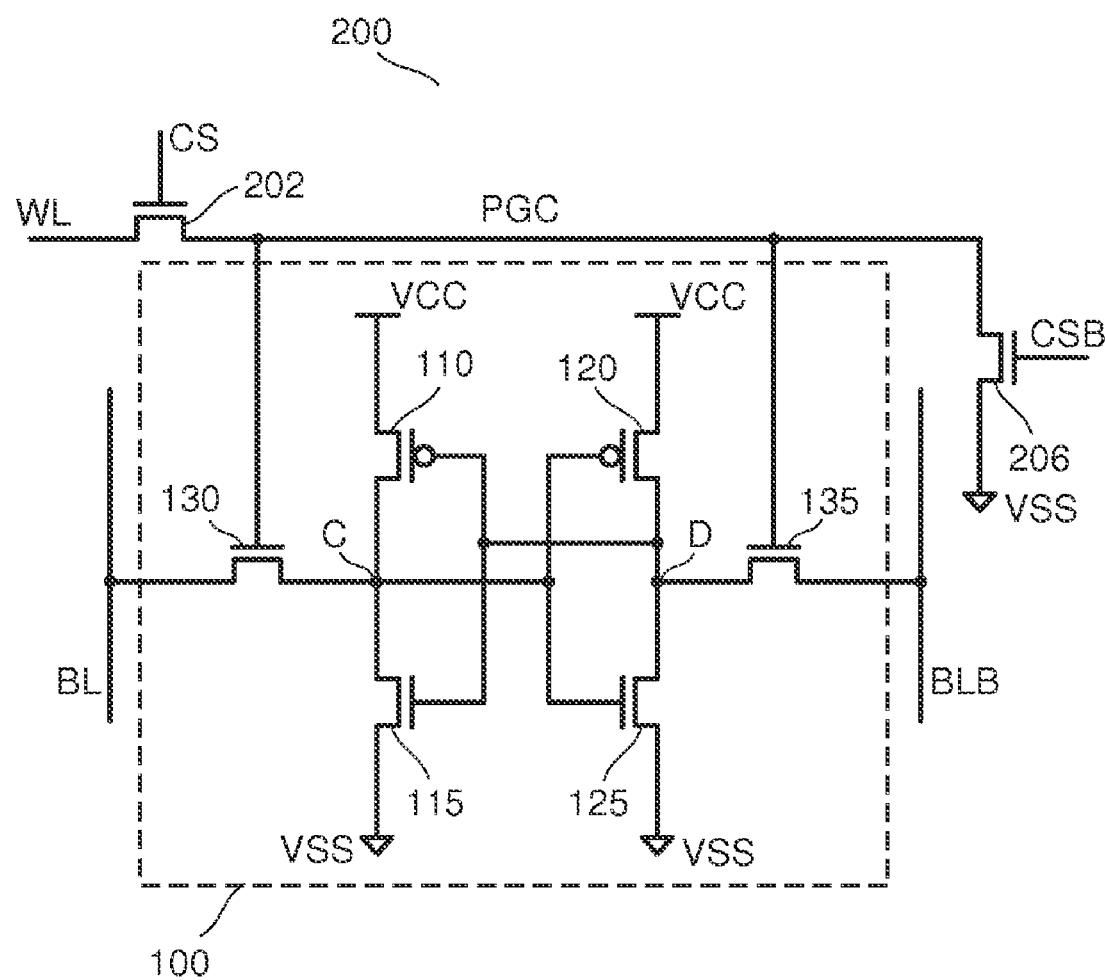
FIG. 2 is a schematic diagram illustrating an 8-T SRAM cell according to one embodiment of the present invention.

FIG. 2 is a schematic diagram illustrating an 8-T SRAM cell 200 according to one embodiment of the present invention. The 8-T SRAM cell 200 is formed by adding two NMOS transistors 202 and 206 to the conventional 6-T SRAM cell 100 of FIG. 1. A source of the NMOS transistor 202 is connected to the common gate PGC of the pass-gate NMOS transistor 130 and 135. A drain of the NMOS transistor 202 is for connecting to an array word-line WL. A gate of the NMOS transistor 202 is connected to a column select line CS. A drain of the NMOS transistor 206 is connected to the common gate PGC of the pass-gate NMOS transistor 130 and 135. A source of the NMOS transistor 206 is connected to a ground VSS. A gate of the NMOS transistor 206 is connected to a complimentary column select line CSB. The CS and CSB are always complimentary to each other. Therefore, there is always one of the NMOS transistors 202 and 206 being turned on and the other being turned off. When the NMOS transistor 202 is turned on while the NMOS transistor 206 is turned off, the pass-gate NMOS transistors 130 and 135 are turned on, and the 8-T SRAM cell 200 is accessible just like in a conventional 6-T SRAM cell 100 of FIG. 1. If the NMOS transistor 202 is turned off by a logic LOW at the CS, the NMOS transistor 206 will be turned on by the logic HIGH at the CSB, as a result, the PGC will be pulled to the VSS and turn off the pass-gate NMOS transistor 130 and 135. However, a voltage at the PGC is lower than a voltage at the WL by a threshold voltage (Vt) of the NMOS transistor 202, which is desirable in a read operation but not desirable in a write operation. In a read operation, since the states of the storage nodes C and D are sensed differentially at the BL and BLB, lowering the voltage at the PGC slightly lowers the sensing current, but improve the signal-to-noise margin. For the write operation, the WL voltage can be boosted to a normal voltage plus the Vt, and then the PGC still receives the normal voltage after the Vt drop by the NMOS transistor 202. This boosted WL voltage may be readily available, as in modern SRAM memories the peripheral voltage is generally higher than the cell core array voltage, and the peripheral voltage can be used directly to the WL during a write operation. Apparently, when boosting WL voltage, the CS voltage should also be boosted.

Referring again to FIG. 2, in order to activate a SRAM cell 200, i.e., exposing the storage nodes C and D to the BL and BLB, respectively, both the WL and the CS has to be in a logic HIGH, that is why a memory array formed by the 8-T SRAM cells 200 can be activated only one cell at a time and avoid disturbing neighboring cells.

Figure 3:
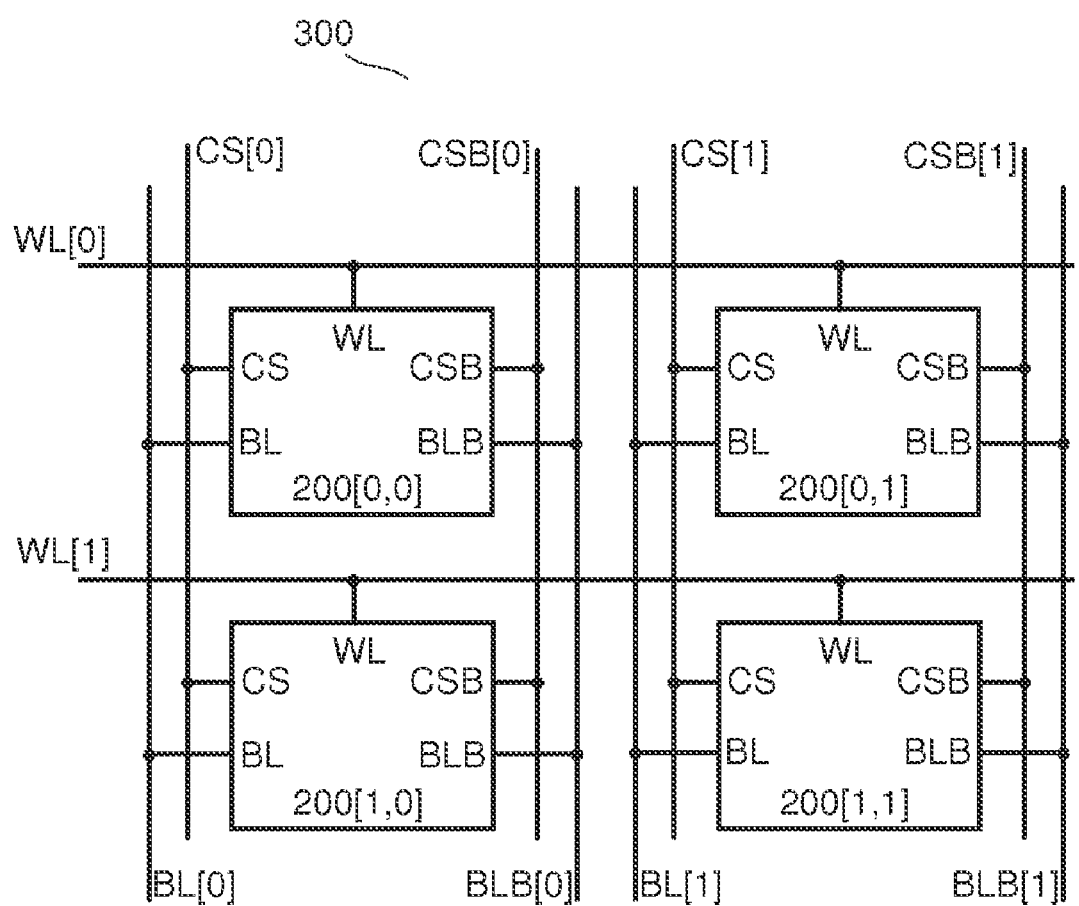
FIG. 3 is a schematic diagram illustrating a small memory array formed by the 8-T SRAM cell of FIG. 2.

FIG. 3 is a schematic diagram illustrating a small memory array 300 formed by the 8-T SRAM cell 200 of FIG. 2. For illustration purpose, the memory array 300 is comprised of only four memory cells 200[0:1, 0:1]. A word-line WL[0] is connected to the WL terminal of the cells 200[0,0] and 200[0,1]. Another word-line WL[1] is connected to the WL terminal of the cells 200[1,0] and 200[1,1]. A bit-line pair BL[0] and BLB[0] are connected to the respective terminals of the cells 200[0,0] and 200[1,0]. Another bit-line pair BL[1] and BLB[1] are connected to the respective terminals of the cells 200[0,1] and 200[1,1]. Similarly, the column select lines CS[0] and CSB[0] are connected to the respective terminals of the cells 200[0,0], and 200[1,0]. Another column select lines CS[1] and the CSB[1] are connected to the respective terminals of the cells 200[0,1] and 200[1,1]. In a read or write operation, when the WL[0] is in a logic HIGH, while the WL[1] is in a logic LOW, and CS[0] is in the logic HIGH while the CS[1] is in the logic LOW, only the cell 200[0,0]'s WL and CS are in the logic HIGH. In this case, only the cell 200[0,0] can be accessed, i.e., read or written, and all other cells, 200[0,1], 200[1,0] and 200[1,1], are isolated because either their WL or CS is in the logic LOW, therefore their pass-gate NMOS transistors 130 and 135 remain off (referring to FIG. 2). That is when accessing the cell 200[0,0], all other cells 200[0,1], 200[1,0] and 200[1,1] are not disturbed at all.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A static random access memory (SRAM) cell comprising:
   a pair of cross-coupled inverters having a first storage node;
   a first NMOS transistor having a source and a drain connected between the first storage node and a first signal line;
   a second NMOS transistor having a source and a drain connected between a gate of the first NMOS transistor and a second signal line, the second NMOS transistor having a gate connected to a third signal line;
   a third NMOS transistor having a source and a drain connected between a ground (VSS) and the gate of the first NMOS transistor, the third NMOS transistor having a gate connected to a fourth signal line, the fourth signal line being complementary to the third signal line; and
   a fourth NMOS transistor having a source and a drain connected between a second storage node of the pair of cross-coupled inverters and a fifth signal line, the second storage node being complimentary to the first storage node.

2. The SRAM cell of claim 1, wherein the first signal line is a bit-line.

3. The SRAM cell of claim 1, wherein the second signal line is a word-line (WL).

4. The SRAM cell of claim 1, wherein the third and fourth signal lines are a pair of column select lines.

5. The SRAM cell of claim 1, wherein the fifth signal line is a bit-line and the first and the fifth signal lines form a bit-line pair.

6. The SRAM cell of claim 1, wherein the cross-coupled inverters are formed by two identical inverters.

7. The SRAM cell of claim 1, wherein the cross-couple inverters are CMOS inverters.

8. A static random access memory (SRAM) cell comprising:
   a pair of cross-coupled inverters having a first storage node;
   a first NMOS transistor having a source and a drain connected between the first storage node and a first bit-line;
   a second NMOS transistor having a source and a drain connected between a gate of the first NMOS transistor and a word-line, and a gate connected to a first signal line; and
   a third NMOS transistor having a source and a drain connected between a ground (VSS) and the gate of the first NMOS transistor, and a gate connected to a second signal line, the second signal line being complementary to the first signal line.

9. The SRAM cell of claim 8, wherein the first and the second signal lines are a pair of column select lines.

10. The SRAM cell of claim 8 further comprising a fourth NMOS transistor having a source and a drain connected between a second storage node of the pair of cross-coupled inverters and a second bit-line, the second storage node being complimentary to the first storage node.

11. The SRAM cell of claim 8, wherein the cross-coupled inverters are formed by two identical inverters.

12. The SRAM cell of claim 8, wherein the cross-couple inverters are CMOS inverters.

13. A static random access memory (SRAM) cell comprising:
   a pair of cross-coupled inverters having a first and a second storage node, the first and the second storage node being complimentary to each other;
   a first NMOS transistor having a source and a drain connected between the first storage node and a first signal line;
   a second NMOS transistor having a source and a drain connected between the second storage node and a second signal line, and a gate connected to a gate of the first NMOS transistor;

a third NMOS transistor having a source and a drain connected between the gate of the first NMOS transistor and a third signal line, and a gate connected to a fourth signal line; and a fourth NMOS transistor having a source and a drain connected between a ground (VSS) and the gate of the first NMOS transistor, and a gate connected to a fifth signal line, the fifth signal line being complementary to the fourth signal line.

14. The SRAM cell of claim 13, wherein the first and the second signal line are a pair of bit-lines.

15. The SRAM cell of claim 13, wherein the third signal line is a word-line (WL).

16. The SRAM cell of claim 13, wherein the fourth and the fifth signal lines are a pair of column select lines.

17. The SRAM cell of claim 13, wherein the cross-coupled inverters are formed by two identical inverters.

18. The SRAM cell of claim 13, wherein the cross-couple inverters are CMOS inverters.

* * * * *